Ｕ S008115527B2

(12) United States Patent
Kimura

(10) Patent No.: US 8,115,527 B2
(45) Date of Patent: Feb. 14, 2012

(54) PLL APPARATUS

(75) Inventor: Hiroki Kimura, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 12/931,779

(22) Filed: Feb. 10, 2011

(65) Prior Publication Data

US 2011/0221490 A1 Sep. 15, 2011

(30) Foreign Application Priority Data

Mar. 9, 2010 (JP) .................................. 2010-052250

(51) Int. Cl.
*H03L 7/06* (2006.01)
(52) U.S. Cl. ....................................... 327/156; 327/147
(58) Field of Classification Search .................. 327/147, 327/156
See application file for complete search history.

(56) References Cited

U.S. PATENT DOCUMENTS

| 6,342,798 | B1 * | 1/2002 | Yoshida | 327/156 |
| 6,677,788 | B2 * | 1/2004 | Miyagawa et al. | 327/156 |
| 7,622,970 | B2 * | 11/2009 | Lee | 327/158 |
| 7,813,214 | B2 * | 10/2010 | Noichi | 365/233.1 |
| 7,884,655 | B2 * | 2/2011 | Marton et al. | 327/156 |
| 2007/0040594 | A1 * | 2/2007 | Jung | 327/156 |
| 2007/0182469 | A1 * | 8/2007 | Zimlich | 327/158 |
| 2010/0060365 | A1 | 3/2010 | Kimura | |
| 2011/0193600 | A1 * | 8/2011 | Isik | 327/156 |
| 2011/0215848 | A1 * | 9/2011 | Koroglu et al. | 327/157 |
| 2011/0227614 | A1 * | 9/2011 | Anandakumar et al. | 327/156 |

FOREIGN PATENT DOCUMENTS

JP 2009-124600 6/2009

* cited by examiner

*Primary Examiner* — Lincoln Donovan
*Assistant Examiner* — Adam Houston
(74) *Attorney, Agent, or Firm* — Jordan and Hamburg LLP

(57) ABSTRACT

There is provided an art to prevent an unstable operation due to temperature in a PLL apparatus in which a proper range of an amplitude level of an external reference frequency signal is specified and a control voltage is supplied to a voltage-controlled oscillator according to whether the amplitude level falls within the proper range or not. The PLL apparatus includes: a switching unit switching a signal that is to be supplied to a control voltage output unit between a signal of a phase comparison unit and a preset signal of a preset signal output unit; a protection circuit provided between a signal path of a reference frequency signal and a ground and having diodes that are connected in inverse parallel in order to regulate an amplitude level of the reference frequency signal; a temperature detection unit detecting an atmospheric temperature of the protection circuit; and a level detection unit detecting the amplitude level of the external reference frequency signal, and threshold values as references for the switching are set according to the detected temperature, thereby coping with a change in the amplitude level due to a temperature characteristic of the diodes.

3 Claims, 11 Drawing Sheets (a)

(b)

(a)

(b)

PLL APPARATUS

BACKGROUND OF THE INVENTION

1. Field of the Invention

The present invention relates to a PLL apparatus in which a control voltage is supplied to a voltage-controlled oscillator according to an amplitude level of an external reference frequency signal.

2. Description of the Related Art

In base stations of next-generation mobile communication, digital terrestrial broadcasting, and so on, required precision of a frequency reference signal is becoming higher. As oscillators of the frequency reference signal, a cesium frequency reference oscillator, a rubidium frequency reference oscillator, a frequency-synchronous reference oscillator based on a GPS signal, and the like are used in systems in broadcasting and communication fields.

However, since these oscillators are generally expensive, reference signals from these oscillators are distributed and used as reference clocks of various kinds of communication systems. As an apparatus thus utilizing the reference signal (external reference signal) to use it in various kinds of communication systems, the present inventor has been considering an apparatus having the structure shown in FIG. 8, for instance, and this PLL apparatus 100 is disclosed in Patent Document 1. Components forming the PLL apparatus 100 will be described in an embodiment of the present invention and therefore, a detailed description thereof will be omitted here.

An outline of the operation of the PLL apparatus 100 will be described. A detector circuit 16 measures an amplitude level (detection voltage) of an external reference signal, and based on the detection voltage, a CPU 41 determines whether the level of the external reference signal falls within a proper range or out of the proper range. Then, when it is determined that the signal level falls within the proper range, a selection switch 15 is switched so that a signal output from a voltage-controlled oscillator 33 to devices (internal reference signal) synchronizes with the external reference signal. On the other hand, when it is determined that the signal level is out of the proper range, such synchronization does not take place and the selection switch 15 is switched so that an output from a fixed voltage supply unit 31 is supplied to the voltage-controlled oscillator 33.

A permissible range of the input level of the external reference signal varies depending on each user, 0 dBm±3 dB in some case or 10 dBm±3 dB in some other case. Therefore, there is a demand that the PLL apparatus 100 be designed so as to allow the input of external reference signals with a wide level range, for example, ranging from −3 dBm to +13 dBm. A possible solution for satisfying such a demand may be to provide a voltage shift circuit shifting an input voltage to the detector circuit 16 to a predetermined range. However, inputting external reference signals in such a wide level range to the PLL apparatus 100 involves a high probability that a relatively high-level signal is input to the apparatus. As a result, an input voltage to an inverter 13 on a preceding stage of a phase comparator 14 becomes an excessive input exceeding rating of the inverter 13. Further, an input voltage to an amplifier 12 becomes an excessive input exceeding rating of the amplifier 12, which involves a risk that the apparatus 100 gets out of order.

Therefore, the present inventor has been considering to provide an excessive input protection circuit 21 shown in FIG. 9 between a filter 11 and the amplifier 12. With the excessive input protection circuit 21 being provided, a current flows to diodes 22, 23 included in the excessive input protection circuit 21 when a signal having an amplitude level over a predetermined level is input from an oscillation source 10 of the external reference signal, which makes it possible to regulate the amplitude level of the frequency signal input to the inverter 13. FIG. 10(a) shows an example of a voltage waveform input to the amplifier 12 when the excessive input protection circuit 21 is not provided, and FIG. 10(b) shows an example of a voltage waveform input to the amplifier 12 when the excessive input protection circuit 21 is provided.

However, the diodes 22, 23 included in the excessive input protection circuit 21 have temperature characteristics, and their breakdown voltages change according to temperature, and according to this change, a characteristic of a detection voltage also changes. Concretely, even under the constant input level of the external reference signal to the PLL apparatus 100, when the temperature becomes high, a large amount of current flows to the diodes 22, 23 and accordingly the detection voltage decreases. FIG. 11 is a graph showing how a correlation between the input level of the external reference signal and the detection voltage changes at each temperature. When the correlation between the input level of the external reference signal and the detection voltage thus shifts according to temperature, the switching to the fixed voltage supply unit 31 takes place even though the amplitude level of the external reference signal is within a permissible range, or the switching to the fixed voltage supply unit 31 does not take place even though the amplitude level is out of the permissible range.

(Patent Document 1)
Japanese Patent Application Laid-open No. 2009-124600

SUMMARY OF THE INVENTION

The present invention was made under the above circumstances, and its object is to provide an art capable of preventing an unstable operation due to temperature in a PLL apparatus in which a proper range of an amplitude level of an external reference frequency signal is specified and a control voltage is supplied to a voltage-controlled oscillator according to whether the amplitude level is within the proper range or not.

A PLL (phase locked loop) apparatus of the present invention is a PLL apparatus in which a phase difference between a phase of an external reference frequency signal and a phase of a frequency signal output from a voltage-controlled oscillator via a frequency division unit is extracted in a phase comparison unit and a control voltage corresponding to the phase difference is supplied to the voltage-controlled oscillator via a control voltage output unit, the apparatus including:

a preset signal output unit outputting a preset signal created in advance, as a substitute for the signal corresponding to the phase difference;

a switching unit switching a signal that is to be supplied to the control voltage output unit between the signal of the phase comparison unit and the preset signal of the preset signal output unit;

a protection circuit provided between a signal path of the reference frequency signal and a ground and having diodes that are connected in inverse parallel in order to regulate an amplitude level of the reference frequency signal;

a temperature detection unit detecting an atmospheric temperature of the protection circuit;

a level detection unit detecting the amplitude level of the external reference frequency signal;

a storage unit storing the atmospheric temperature and an upper limit threshold value and a lower limit threshold value of the amplitude level in a related manner, in order to cope with a change in the amplitude level due to a temperature characteristic of the diodes; and a switching control unit reading the upper limit threshold value and the lower limit threshold value of the amplitude level, corresponding to a temperature detection value of the temperature detection unit, and determining whether the amplitude level detected by the level detection unit falls within a range of the threshold values to switch the switching unit to the phase comparison unit side when the amplitude level falls within the range and to switch the switching unit to the preset signal output unit side when the amplitude level does not fall within the range. A frequency division ratio of the frequency division unit may be "1", and in this case, the frequency division unit corresponds to a conductive path.

The apparatus may be structured such that it further includes a temperature detection unit detecting an atmospheric temperature of the level detection unit, wherein the storage unit stores a set of the atmospheric temperature of the protection circuit and the atmospheric temperature of the level detection unit and the upper limit threshold value and the lower limit threshold value of the amplitude level in a related manner, in order to cope with a change in the amplitude level due to a temperature characteristic of the level detection unit in addition to the temperature characteristic of the diodes. In this case, the temperature detection unit detecting the atmospheric temperature of the protection circuit may serve as the temperature detection unit detecting the atmospheric temperature of the level detection unit.

In the PLL apparatus of the present invention, the atmospheric temperature of the protection circuit in which the diodes are connected in inverse parallel is detected, and according to the detected atmospheric temperature, the threshold values based on which it is determined whether the amplitude level of the external reference frequency signal falls within their range are set. This enables the high-precision switching either to the signal corresponding to the phase difference between the phase of the reference frequency signal and the phase of the frequency signal output from the voltage-controlled oscillator via the frequency division unit or to the preset signal created in advance, which makes it possible to prevent a malfunction of the switching operation of the apparatus due to temperature.

DETAILED DESCRIPTION OF THE PREFERRED EMBODIMENT

Figure 1:
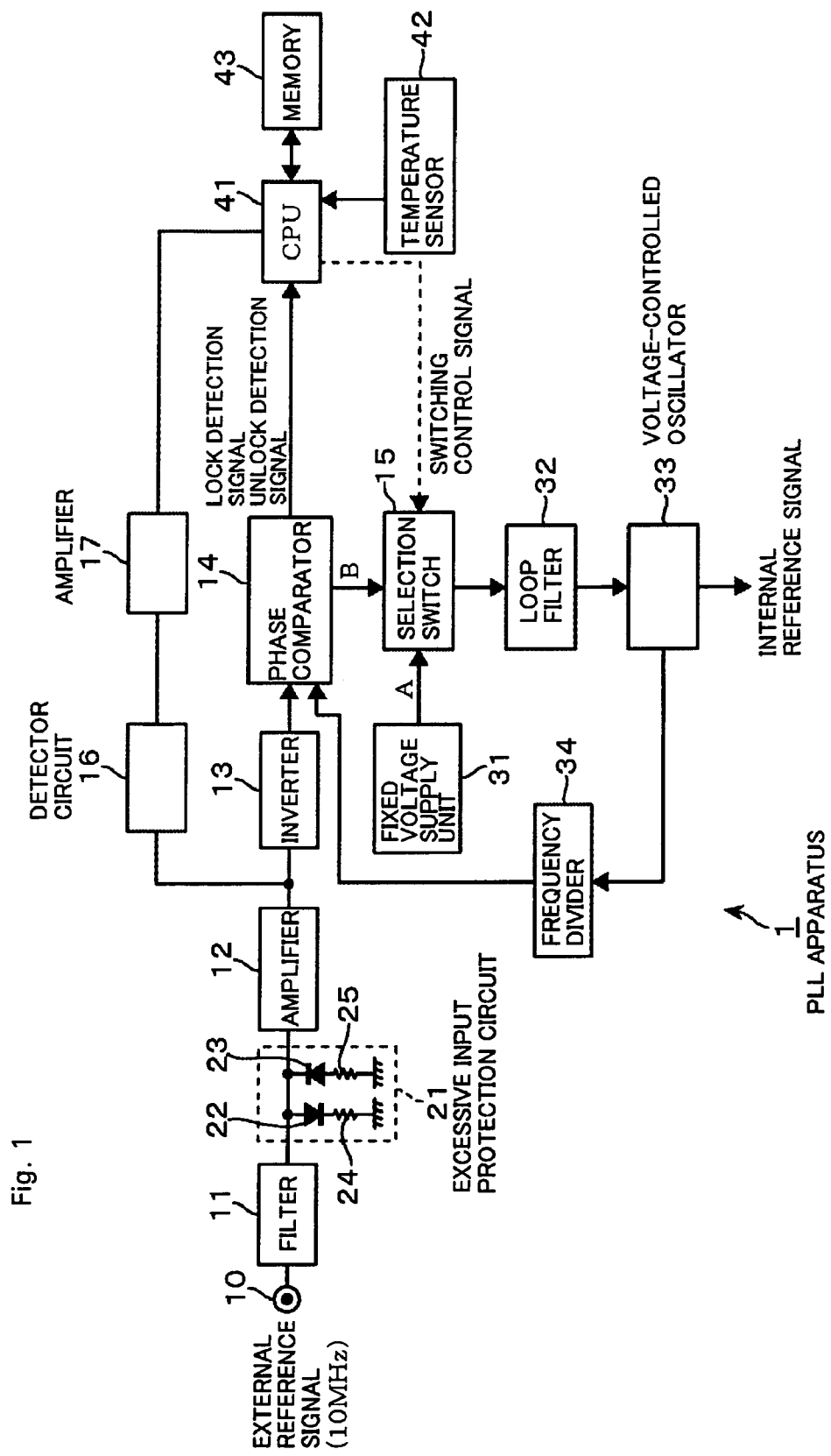
FIG. 1 is a block diagram of a PLL apparatus according to an embodiment of the present invention.

A PLL apparatus 1 according to an embodiment of the present invention will be described with reference to FIG. 1. The PLL apparatus 1 is connected to an external reference signal oscillation source 10, and a reference frequency signal (external REF) of, for example, 10 MHz is output from the oscillation source 10 to a filter 11 included in the PLL apparatus 1. An output level of the external reference signal oscillation source 10 is, for example, −3 dBm to +13 dBm.

The filter 11 filters out, for example, harmonic components of the external reference signal (external REF). An excessive input protection circuit 21 is provided on a subsequent stage of the filter 11. The excessive input protection circuit 21 includes diodes 22, 23 connected in parallel in reverse directions from each other. The diodes 22, 23 are grounded respectively via resistors 24, 25 each having a function of setting an operating point of the diode. As described in DESCRIPTION OF THE RELATED ART, when an amplitude level of the external reference signal from the external reference signal oscillation source 10 becomes high, a current flows to the diodes 22, 23, which makes it possible to regulate the amplitude level of the signal output to a subsequent stage.

On the subsequent stage of the excessive input protection circuit 21, an amplifier 12 is provided. The amplifier 12 amplifies the output signal from the excessive input protection circuit 21 to output the resultant signal to an inverter 13 and a detector circuit 16 on subsequent stages. The inverter 13 converts the input signal with a sine wave to a signal with a rectangular wave and outputs the resultant signal to a phase comparator 14 provided on a subsequent stage thereof. The phase comparator 14 compares phases of the signal output from the inverter 13 and a frequency-divided signal output from a later-described frequency divider 34 and outputs a phase difference signal corresponding to a phase difference therebetween. Further, when detecting synchronization (lock) as a result of comparing the phases of the external reference signal and the frequency-divided signal, the phase comparator 14 outputs a lock detection signal to a CPU 41, and when detecting asynchronization (unlock), the phase comparator 14 outputs an unlock detection signal to the CPU 41.

The PLL apparatus 1 includes a fixed voltage supply unit 31 serving as a preset signal output unit, a loop filter 32 serving as a control voltage output unit, a selection switch 15 serving as a switching unit, and the CPU 41 serving as a switching control unit. The selection switch 15 switches a connection destination of the loop filter 32 between the phase comparator 14 and the fixed voltage supply unit 31 according to a switching control signal from the CPU 41. Specifically, when a switching control signal selecting an external reference synchronization mode (B) in which the phase comparator 14 and the loop filter 32 are connected and the external reference signal is used as a basis of the operation (external reference synchronization mode selection signal) is input from the CPU 41, the selection switch 15 connects the phase comparator 14 and the loop filter 32. On the other hand, when a switching control signal selecting a fixed voltage mode (A) in which the fixed voltage supply unit 31 and the loop filter 32 are connected and a fixed voltage from the fixed voltage supply unit 31 is used as a basis of the operation (fixed voltage mode selection signal) is input from the CPU 41, the selection switch 15 connects the fixed voltage supply unit 31 and the loop filter 32.

The fixed voltage supply unit 31 outputs a signal with a fixed voltage adjusted by, for example, a variable resistor, as a substitute for the phase difference signal. The loop filter 32 smoothes an output voltage from the phase comparator 14, that is, a control voltage that is to be input to a voltage-controlled oscillator 33. On a subsequent stage of the loop filter 32, the voltage-controlled oscillator 33 is provided, and the voltage controlled oscillator 33 changes a frequency based on the control voltage from the loop filter 32 and oscillates and outputs a signal with a desired frequency (internal reference signal). As described above, owing to the switching of the selection switch 15, the signal input from the loop filter 32 is switched, so that the oscillation and output of the voltage-controlled oscillator 33 is controlled. As the voltage-controlled oscillator, a voltage-controlled crystal oscillator (VCXO), a voltage-controlled oven-controlled crystal oscillator (VC-OCXO), or the like is used. The frequency divider (frequency division unit) 34 is connected to the voltage-controlled oscillator 33, and the frequency divider 34 N-divides the frequency of the internal reference signal output from the voltage-controlled oscillator 33 and outputs the resultant signal to the phase comparator 14 as previously described.

The detector circuit 16 serving as a level detection unit is provided between the amplifier 12 and the inverter 13, and an amplifier 17 is provided on a subsequent stage of the detector circuit 16. The amplifier 17 is connected to the aforesaid CPU 41.

The detector circuit 16 is a circuit converting the output signal from the amplifier 12 to a direct-current voltage in order to detect an amplitude level of the output signal from the amplifier 12. The amplifier 17 multiplies the signal having undergone the detection in the detector circuit 16 to output the resultant signal to the CPU 41. Based on the detection voltage signal output from the amplifier 17, the CPU 41 detects the amplitude level of the external reference signal.

The PLL apparatus 1 further includes a temperature sensor 42. The temperature sensor 42 is provided near the excessive input protection circuit 21, the filter 11, the detector circuit 17, and the amplifiers 12, 17 which influence a detection characteristic based on which the amplitude level of the external reference signal is detected, and outputs a detection signal to the CPU 41 according to a temperature that it measures. A memory (storage unit) 43 is connected to the CPU 41, and temperature set values Ta, Tb, Tc, Td based on which it is determined to which temperature range the detected temperature belongs as will be described later are stored in the memory 43. Further, threshold values V (HH, HL, LH, LL) of the detection voltage for a room temperature range, which serve as references for the switching of the selection switch 15, and offset values (Va, Vb, Vc, Vd) for correcting the detection threshold values V according to the detected temperature are stored in the memory 43.

Figure 2:
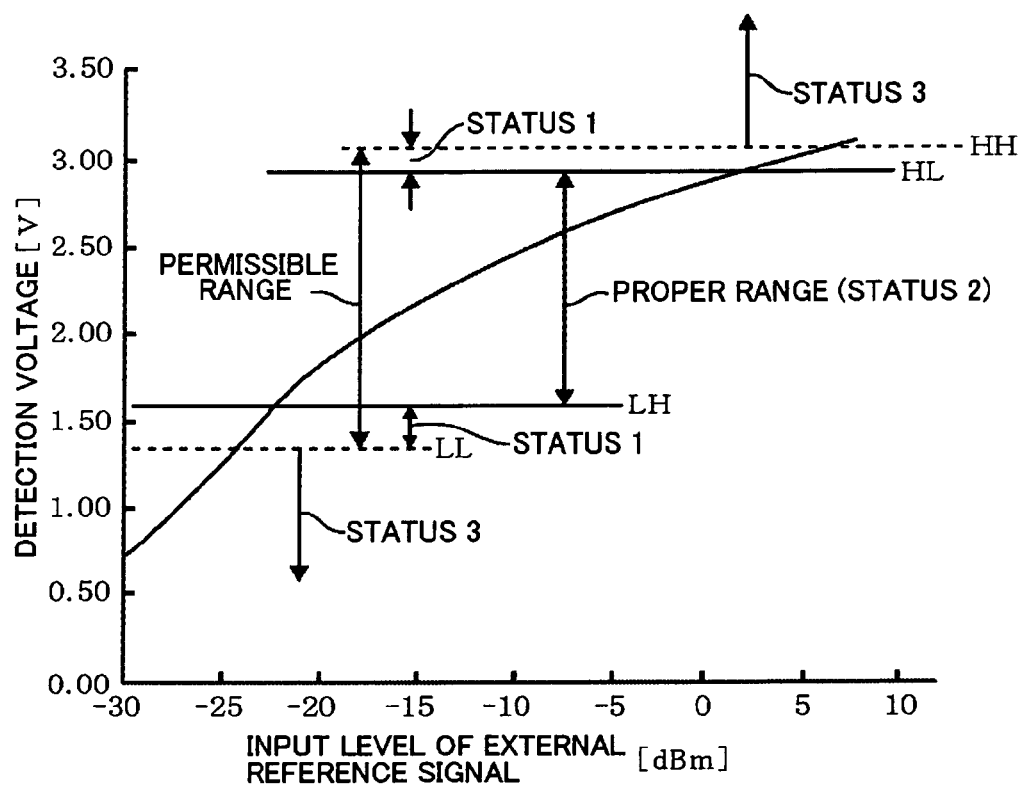
FIG. 2 is a graph showing an outline of level detection of an external reference signal.

Subsequently, an outline of the switching control between the fixed voltage mode A using the preset signal from the fixed voltage supply unit 31 and the external reference mode B using the external reference signal will be described with reference to FIG. 2. FIG. 2 shows a graph line 51 representing a characteristic of an external reference signal level detection voltage (detection voltage) [V] with respect to an input level [dBm] of the external reference signal to the PLL apparatus 1, at a predetermined temperature, for example, at room temperature. A proper range of the detection voltage is set for this characteristic, according to simulations, experiments, and the like.

In the proper range, the external reference synchronization mode (B) is adopted and the output of the voltage-controlled oscillator 33 is synchronized with the output of the external reference signal. Outside the proper range, the fixed voltage mode (A) is adopted and the switching to the fixed voltage takes place. The upper limit permissible value HH, the upper limit proper value HL, the lower limit proper value LH, and the lower limit permissible value LL which are the threshold values as references for such mode switching are set. When the detection voltage falls within a range not lower than LH nor greater than HL, it is determined that the detection voltage falls within the proper range, and the operation in the external reference synchronization mode (B) is performed.

Further, during a period when the detection voltage increases over HL to become HH and during a period when the detection voltage decreases below LH to become LL, the external reference synchronization mode (B) is maintained. Then, when the detection voltage exceeds HH and when the detection voltage becomes below LL, the CPU 41 determines that the detection voltage is out of the proper range and switches the mode to the fixed voltage mode (A).

Further, even when the detection voltage gradually decreases to HH from a value higher than HH, the fixed voltage mode (A) is maintained, and when the detection voltage decreases to HL, the mode is switched to the external reference synchronization mode (B). Further, even when the detection voltage gradually increases up to LL from a value lower than LL, the fixed voltage mode (A) is maintained, and when the detection voltage increases up to LH, the mode is switched to the external reference synchronization mode (B). Owing to such mode switching control, the switching between the external reference synchronization mode (B) and the fixed voltage mode (A) due to a change in the detection voltage near the proper range frequently takes place, thereby preventing the output from the PLL apparatus 1 from becoming unstable.

A status when the detection voltage is within the proper range (LH≦detection voltage≦HL) as described above will be called Status 2. Further, a status of HH<the detection voltage and a status of the detection voltage<LL, in which cases the detection voltage is out of the permissible range, will be called Status 3. Further, a status of LL≦the detection voltage<LH and a status of HL<the detection voltage≦HH, that is, a status when the detection voltage is not within the proper range but is within the permissible range will be called Status 1.

Incidentally, as described in DESCRIPTION OF THE RELATED ART, the diodes 22, 23 included in the excessive input protection circuit 21, the filter 11, the detector circuit 16, and the amplifiers 12, 17 have temperature characteristics. Therefore, the characteristic of the detection voltage [V] with respect to the input level of the external reference signal [dBm] shown in FIG. 2, changes according to temperature. Therefore, as previously described, in the PLL apparatus 1, the atmospheric temperatures of these units of the PLL apparatus 1 are detected, and it is determined to which of a room temperature range, a first low temperature range, a second low temperature range, a first high temperature range, and a second high temperature range each of the detected temperatures belongs. Here, the temperature becomes higher in order of the second low temperature range<the first low temperature range<the room temperature range<the first high temperature range<the second high temperature range.

The CPU 41 determines that the temperature is in the second high temperature range in the case of the pre-set set temperature Td<the detected temperature, and is in the first high temperature range in the case of the set temperature Tb<the detected temperature≦the set temperature Td. Further, the CPU 41 determines that the temperature is in the room temperature range in the case of the set temperature Ta≦the detected temperature≦the set temperature Tb, is in the first low temperature range in the case of the set temperature Tc≦the detected temperature<the set temperature Ta, and is in the second low temperature range in the case of the detected temperature<the set temperature Tc.

In the memory 43, HH, HL, LH, and LL (they will be collectively described as a detection threshold value V) for the room temperature range and the offset values Va, Vb, Vc, Vd corresponding to the first low temperature range, the first high temperature range, the second low temperature range, and the second high temperature range respectively are stored. When determining that the detected temperature belongs to the room temperature range, the CPU 41 determines the status of the detection voltage based on the detection threshold value V and switches the mode either to the fixed voltage mode (A) or to the external reference synchronization mode (B) according to the determination. When determining that the detected temperature belongs to the first low temperature range, the first high temperature range, the second low temperature range, or the second high temperature range, the CPU 41 sets threshold values corresponding to the detected temperature according to the detection threshold value V and the offset value corresponding to the detected temperature, determines the status of the detection voltage based on the threshold values, and switches the mode either to the fixed voltage mode (A) or to the external reference synchronization mode (B) according to the determination. In this manner, in switching the mode, it is possible to cancel a change in the detection voltage due to the temperature by correcting the detection threshold values according to the temperature.

Figure 3:
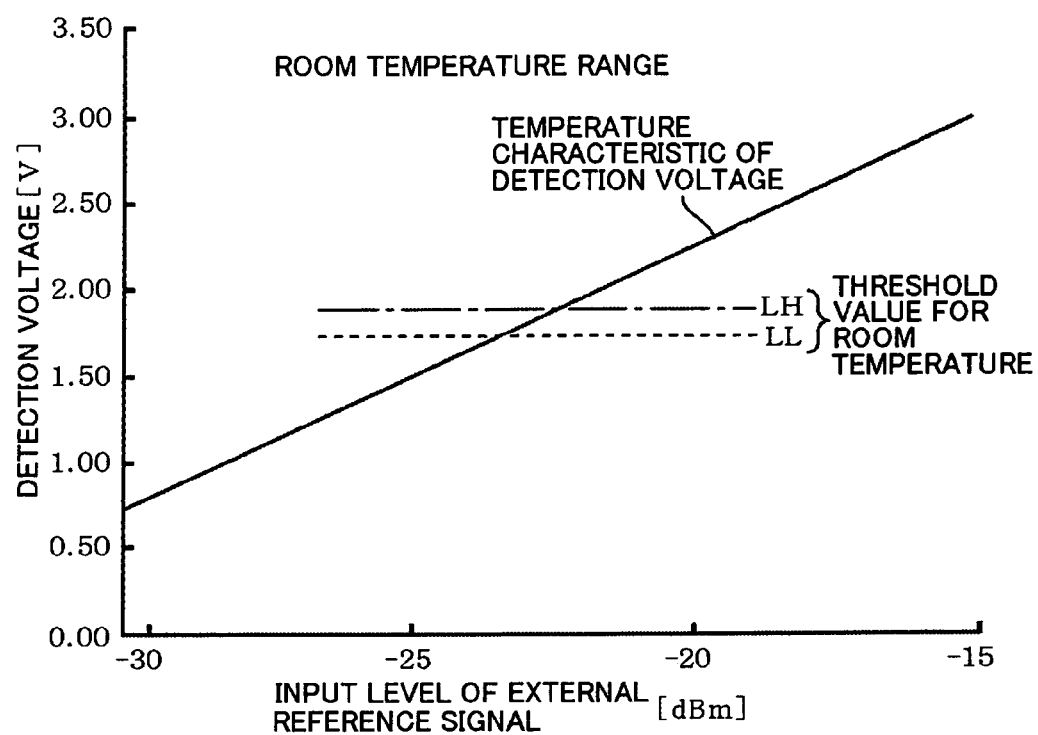
FIG. 3 is a graph showing threshold values.
Figure 4:
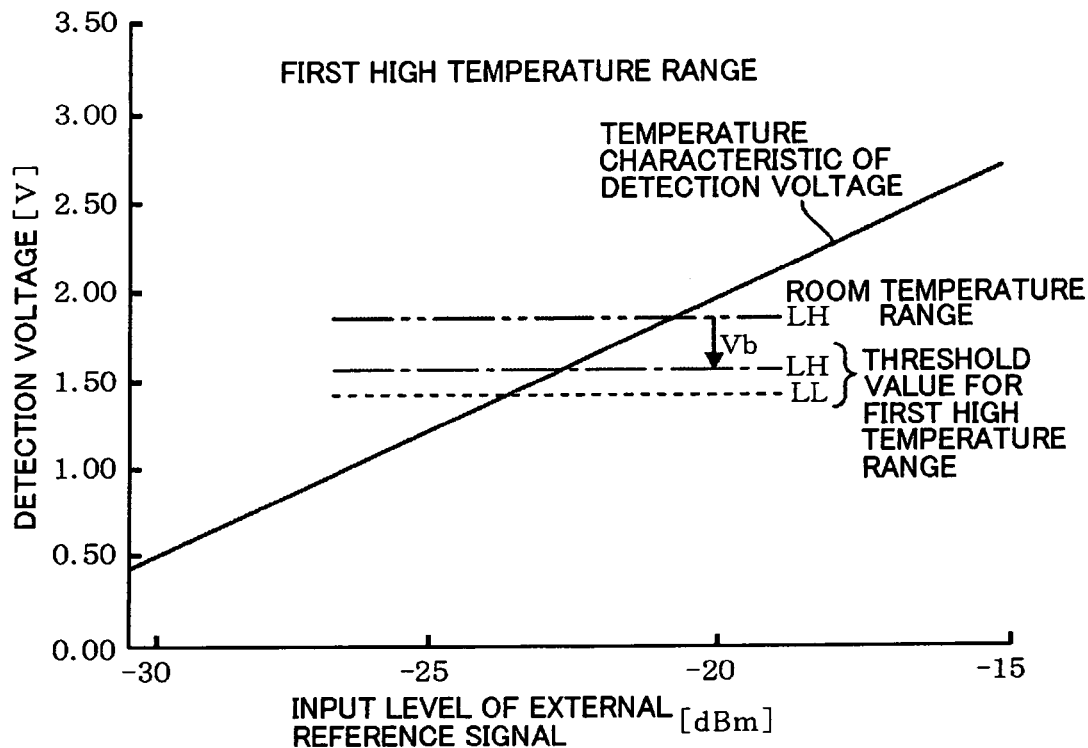
FIG. 4(a) and FIG. 4(b) are graphs showing changes in the threshold values.
Figure 4:
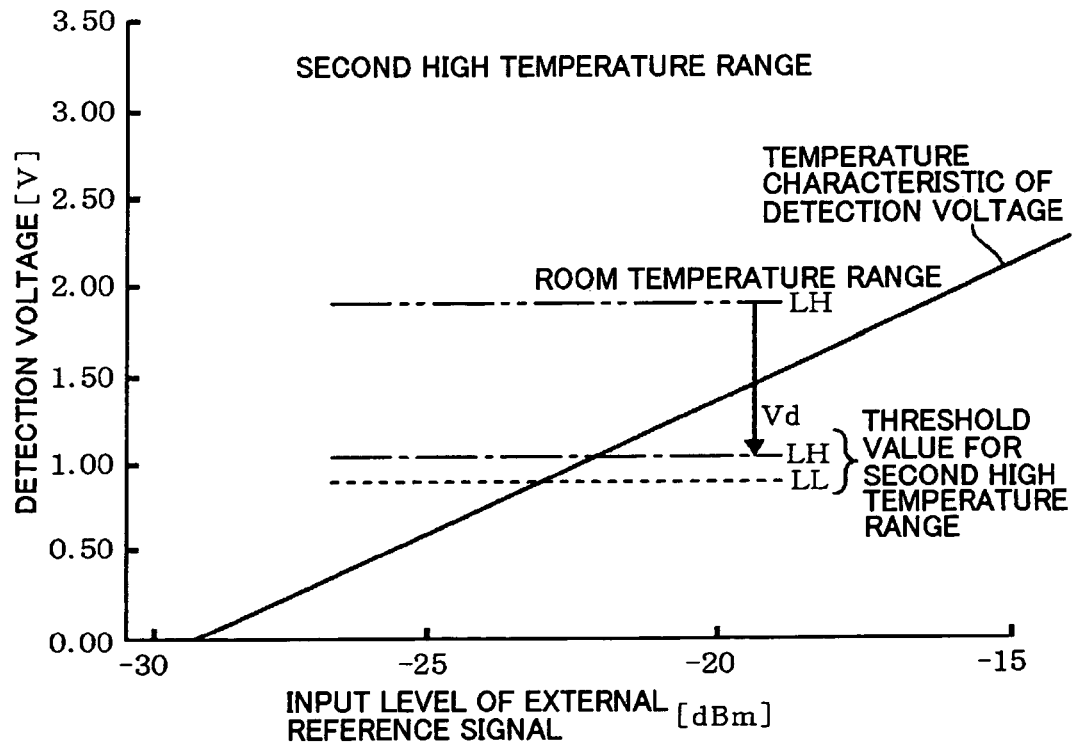
Figure 5:
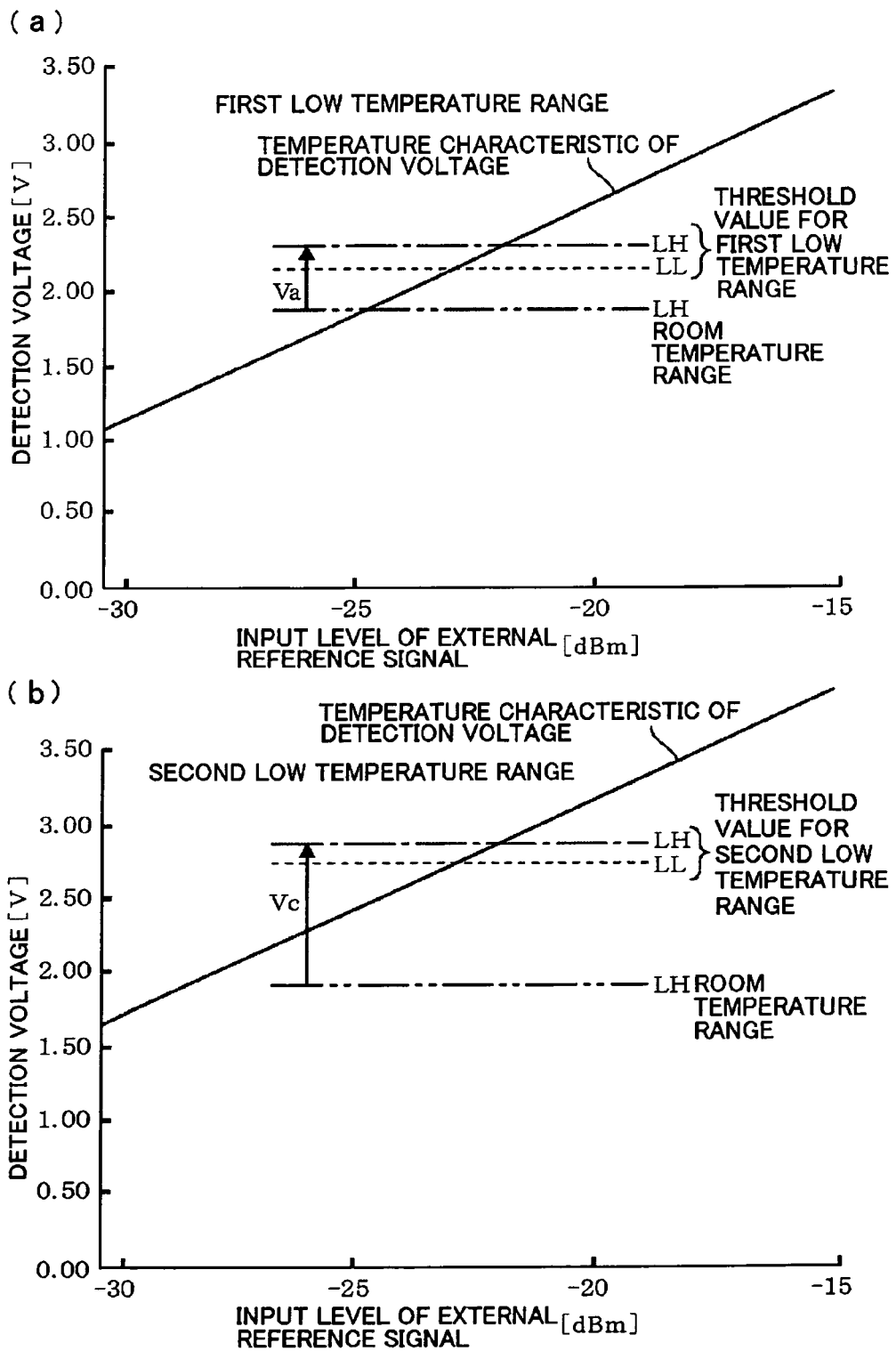
FIG. 5(a) and FIG. 5(b) are graphs showing changes in the threshold values.

FIG. 3 shows LH and LL included in the detection threshold value V for the room temperature range. FIG. 4(a) and FIG. 4(b) show the threshold values LH and LL for the first high temperature range and those for the second high temperature range respectively, and FIG. 5(a) and FIG. 5(b) show the threshold values LH and LL for the first low temperature range and those for the second low temperature range respectively. In FIG. 3 to FIGS. 5(a), (b), the dashed line represents LH and the dotted line represents LL, and the solid graph line represents the temperature characteristic of the detection voltage at a predetermined temperature included in each of the temperature ranges. Further, in FIGS. 4(a), (b) and FIGS. 5(a), (b), LH for the room temperature range is shown by the two-dot chain line for comparison.

In the first high temperature range, the detection threshold value V for the room temperature range−the offset value Vb is calculated and the corrected HH, HL, LH, and LL are set. In the second high temperature range, the detection threshold value V for the room temperature range−the offset value Vd is calculated and the corrected HH, HL, LH, and LL are set. In the first low temperature range, the detection threshold value V for the room temperature range+the offset value Va is calculated and the corrected HH, HL, LH, and LL are set. In the second low temperature range, the detection threshold value V for the room temperature range+the offset value Vc is calculated and the corrected HH, HL, LH, and LL are set. In order to prevent the complication of the drawing, FIGS. 4(a), (b) and FIGS. 5(a), (b) show how LH as a representative of HH, HL, LH, and LL changes by the offset, but the other HH, HL, and LL also change by the offset similarly to LH.

Figure 6:
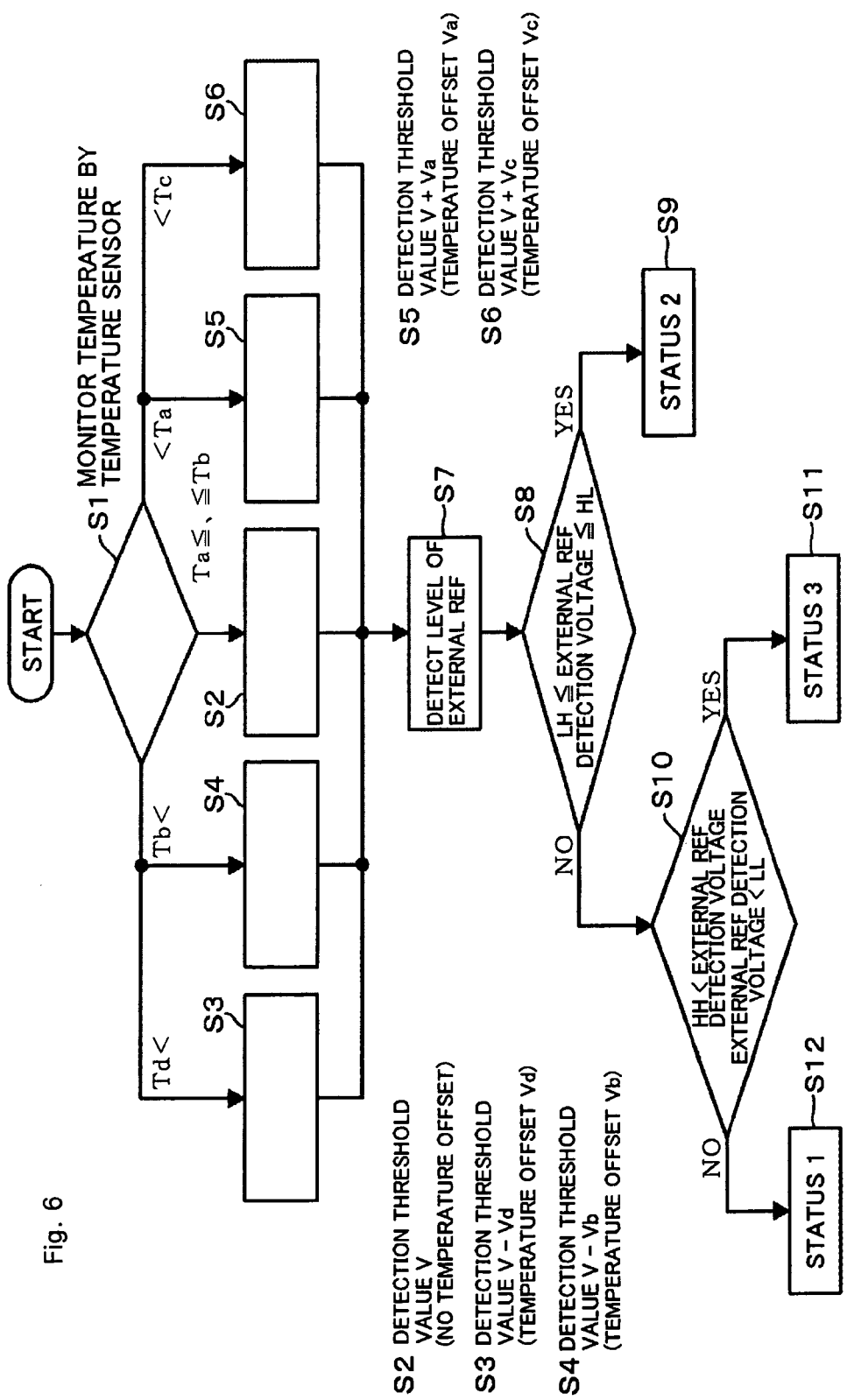
FIG. 6 is a flowchart of a status specifying process according to a temperature characteristic.
Figure 7:
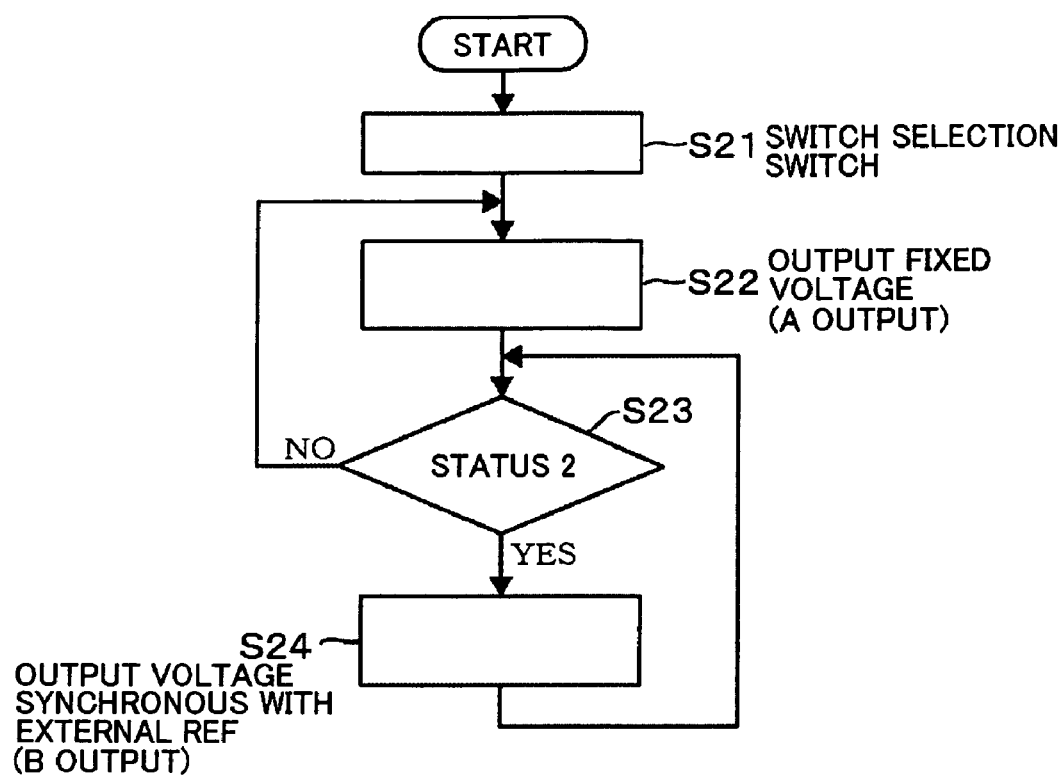
FIG. 7 is a flowchart of a selection switch switching control process.
Figure 8:
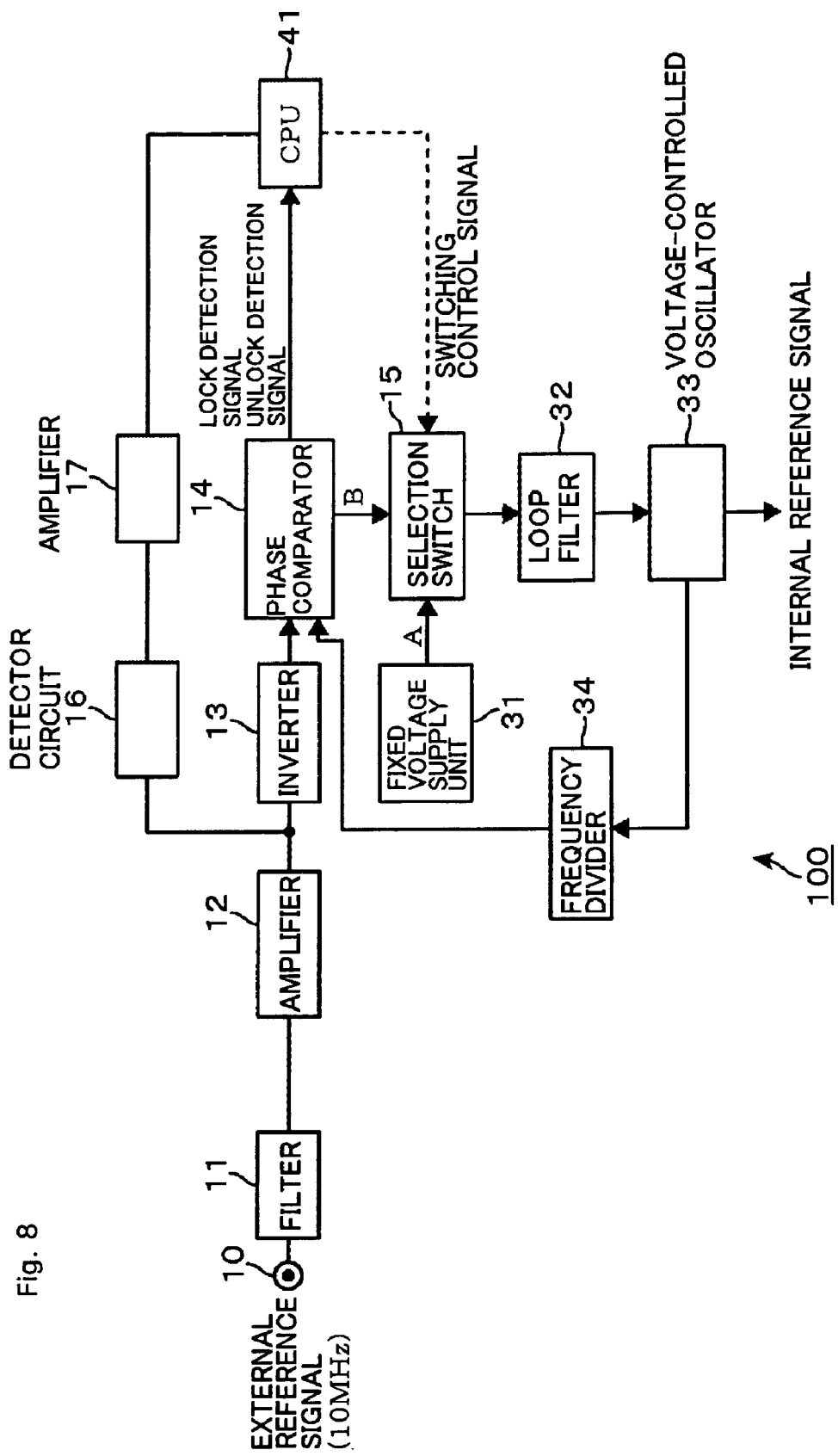
FIG. 8 is a block diagram of a PLL apparatus according to a conventional embodiment.
Figure 9:
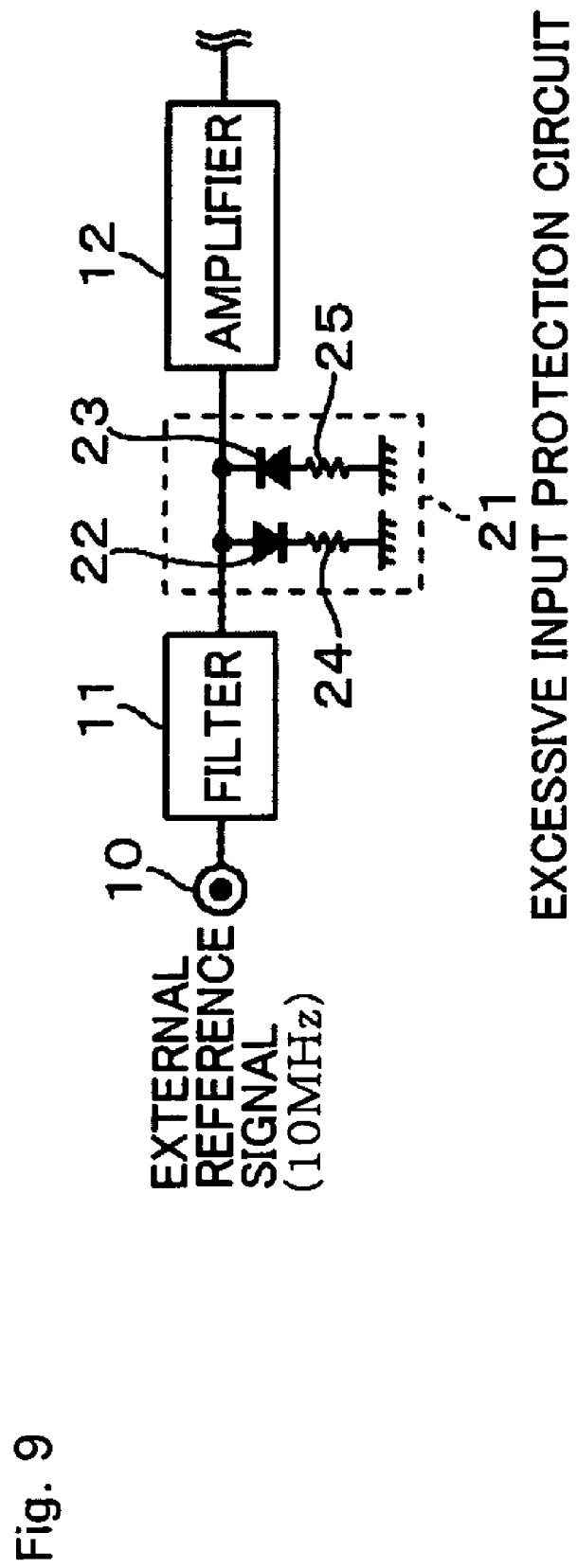
FIG. 9 is a circuit diagram of an excessive input protection circuit.
Figure 10:
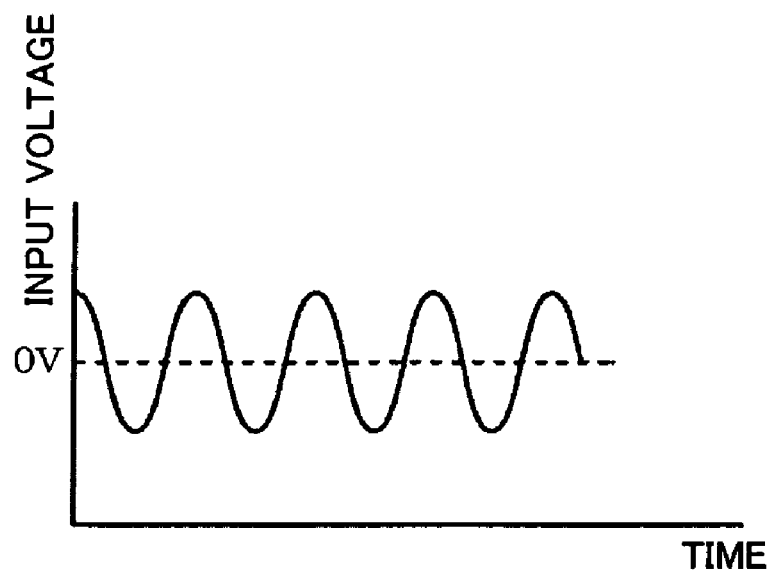
FIG. 10(a) and FIG. 10(b) are graphs used to explain operations of the excessive input protection circuit.
Figure 10:
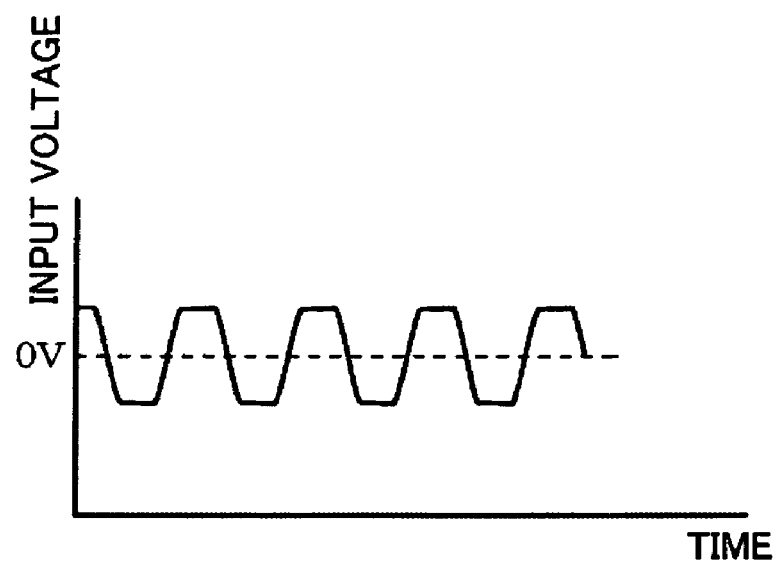
Figure 11:
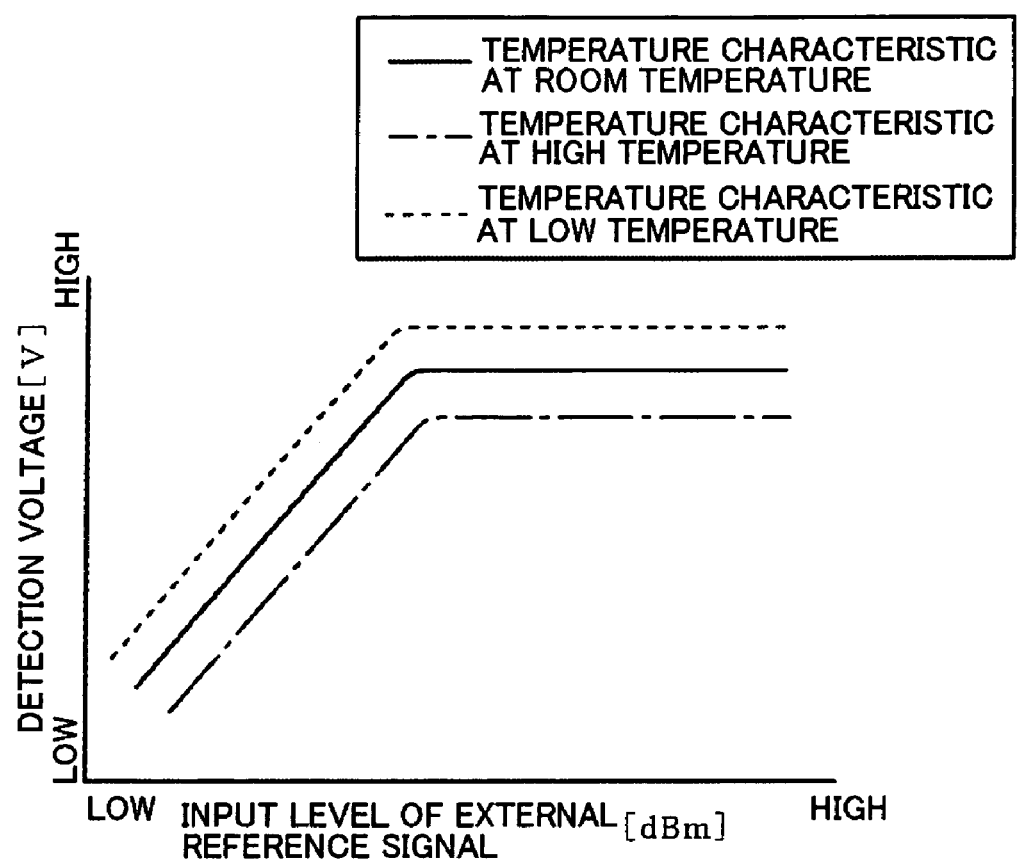
FIG. 11 is a graph used to explain a temperature characteristic of a detection voltage.

Subsequently, the operation of the PLL apparatus 1 will be described with reference to the flowcharts in FIG. 6 and FIG. 7. The flow in FIG. 6 is a flow where the CPU 41 decides in which of the aforesaid statuses the detection voltage is, and the flow in FIG. 7 is a flow showing the mode switching according to the decided status.

Upon activation of the PLL apparatus 1, the CPU 41 outputs the switching control signal to the selection switch 15 so that the fixed voltage mode (A) is selected (Step S21), and the selection switch 15 comes into a state of connecting the fixed voltage supply unit 31 and the loop filter 32. Consequently, the fixed voltage supplied from the fixed voltage supply unit 31 is input to the voltage-controlled oscillator 33 via the loop filter 32 and a signal is output from the voltage-controlled oscillator 33 (Step S22).

Then, the detection signal of the temperature sensor 42 is output to the CPU 41, and the CPU 41 determines to which of the room temperature range, the first low temperature range, the first high temperature range, the second low temperature range, and the second high temperature range the atmospheric temperature of the PLL apparatus 1 belongs (Step S1). When it is determined that the atmospheric temperature falls in the room temperature range, the detection threshold value V is read and HH, HL, LH, and LL of the detection threshold value V are decided as the threshold values (Step S2).

When it is determined that the atmospheric temperature falls in the second high temperature range, the detection threshold value V and the offset value Vd are read, V−Vd is calculated, and the calculated HH, HL, LH, LL are decided as the threshold values (Step S3). When it is determined that the atmospheric temperature falls in the first high temperature range, the detection threshold value V and the offset value Vb are read, V−Vb is calculated, and the calculated HH, HL, LH, and LL are decided as the threshold values (Step S4). When it is determined that the atmospheric temperature falls in the first low temperature range, the detection threshold value V and the offset value Va are read, V+Va is calculated, and the calculated HH, HL, LH, and LL are decided as the threshold values (Step S5). When it is determined that the atmospheric temperature falls in the second low temperature range, the detection threshold value V and the offset value Vc are read, V+Vc is calculated, and the calculated HH, HL, LH, and LL are decided as the threshold values (Step S6).

Further, the external reference signal undergoes the detection in the detector circuit 16, and the resultant signal is amplified by the amplifier 17, which outputs the amplified signal to the CPU 41. Based on this output, the CPU 41 detects the level (amplitude level) of the detection voltage of the external reference signal (Step S7). Subsequently, it is determined whether the decided threshold values and the detected level of the detection voltage are in the relation of LH≦the detection voltage≦HL (Step S8).

When it is determined that the relation of LH≦the detection voltage≦HL holds, it is determined that the detection voltage is in the proper range (Status 2) (Step S9). When it is determined that the relation of LH≦the detection voltage≦HL does not hold, it is subsequently determined whether the relation between the decided threshold values and the detected level of the detection voltage is HH<the detection voltage or the detection voltage<LL (Step S10). When it is determined that the relation of HH<the detection voltage holds or the relation of the detection voltage<LL holds, it is determined that the detection voltage is not in the permissible range (Status 3) (Step S11). When it is determined that neither the relation of HH<the detection voltage nor the relation of the detection voltage<LL holds, it is determined that the detection voltage is in the permissible range though not in the proper range (Status 1).

After such determination of the status, the CPU 41 determines whether the detection voltage is in Status 2 or not (Step S23), and when determining that the detection voltage is in Status 2, the CPU 41 outputs the switching control signal to the selection switch 15 so that the external reference synchronization mode (B) is executed, and the signal from the phase comparator 14 is output to the loop filter 32 (S24). When it is determined that the detection voltage is not in Status 2, the switching control signal is output to the selection switch 15 so that the fixed voltage mode (A) is executed, and the fixed voltage is output to the loop filter 32. Such temperature detection and level detection of the detection voltage are constantly performed during the activation of the apparatus 1, and the CPU 41 performs the switching of the selection switch 15 according to the above-described flow.

According to the PLL apparatus 1, the detection threshold value V is corrected according to the temperature so that the temperature characteristics of the respective units including the excessive input protection circuit 2 are cancelled, the corrected threshold values and the level of the detection voltage are compared, and the mode is switched between the fixed mode (A) and the external reference synchronization mode (B). Therefore, it is possible to switch the mode accurately according to the amplitude level of the external reference signal, which enables the stable oscillation control of the voltage-controlled oscillator 33.

Incidentally, the memory 43 may store, for example, a relational expression relating the detected temperature and the offset value, instead of storing the offset values for the respective detected temperature ranges, and when the temperature is detected, the offset value may be calculated based on the relational expression, and the threshold value may be corrected by using the offset value.

Further, in the above-described example, the preset signal output unit is structured as the fixed voltage supply unit 31 to output the fixed preset voltage, but the preset voltage may be a pulse voltage whose pulse width is modulated. Another possible structure may be to sequentially retrieve phase difference data during, for example, a preset time when the signal level of the external reference signal is normal (the phase difference data previously retrieved are sequentially erased), cyclically read time-series data of the phase difference data when the selection switch 15 is switched to the preset voltage side, and output a voltage corresponding to the read data from the preset voltage output unit.

In the above-described example, the single temperature sensor 42 detects the temperatures of the atmospheres in which the detector circuit 16 and the excessive input protection circuit 21 are placed, but different first temperature sensor and second temperature sensor may be provided to detect the temperature of the atmosphere in which the detector circuit 16 is placed and the temperature of the atmosphere in which the excessive input protection circuit 21 is placed, respectively. In this case, a first offset value corresponding to each of the aforesaid temperature ranges detected by the first temperature sensor and a second offset value corresponding to each of the temperature ranges detected by the second temperature sensor are stored in the memory 43. The upper limit threshold value and the lower limit threshold value of the detection voltage may be decided by correcting the aforesaid detection threshold value V for the room temperature range by these first and second offset values. The first temperature sensor may measure the temperatures of the atmospheres of the aforesaid units of the apparatus that influence the detection voltage, except the detection circuit 16.

What is claimed is:

1. A PLL apparatus in which a phase difference between a phase of an external reference frequency signal and a phase of a frequency signal output from a voltage-controlled oscillator via a frequency division unit is extracted in a phase comparison unit and a control voltage corresponding to the phase difference is supplied to the voltage-controlled oscillator via a control voltage output unit, the apparatus comprising:

a preset signal output unit outputting a preset signal created in advance, as a substitute for the signal corresponding to the phase difference;

a switching unit switching a signal that is to be supplied to the control voltage output unit between a signal of the phase comparison unit and the preset signal of the preset signal output unit;

a protection circuit provided between a signal path of the reference frequency signal and a ground and having diodes that are connected in inverse parallel in order to regulate an amplitude level of the reference frequency signal;

a temperature detection unit detecting an atmospheric temperature of the protection circuit;

a level detection unit detecting the amplitude level of the external reference frequency signal;

a storage unit storing the atmospheric temperature and an upper limit threshold value and a lower limit threshold value of the amplitude level in a related manner, in order to cope with a change in the amplitude level due to a temperature characteristic of the diodes; and a switching control unit reading the upper limit threshold value and the lower limit threshold value of the amplitude level, corresponding to a temperature detection value of the temperature detection unit, and determining whether the amplitude level detected by the level detection unit falls within a range of the threshold values to switch the switching unit to the phase comparison unit side when the amplitude level falls within the range and to switch the switching unit to the preset signal output unit side when the amplitude level does not fall within the range.

2. The PLL apparatus according to claim 1, further comprising a temperature detection unit detecting an atmospheric temperature of the level detection unit, wherein the storage unit stores a set of the atmospheric temperature of the protection circuit and the atmospheric temperature of the level detection unit and the upper limit threshold value and the lower limit threshold value of the amplitude level in a related manner, in order to cope with a change in the amplitude level due to a temperature characteristic of the level detection unit in addition to the temperature characteristic of the diodes.

3. The PLL apparatus according to claim 2, wherein the temperature detection unit detecting the atmospheric temperature of the protection circuit serves as the temperature detection unit detecting the atmospheric temperature of the level detection unit.

\* \* \* \* \*